US012316283B2

(12) United States Patent
de Jong et al.

(10) Patent No.: US 12,316,283 B2
(45) Date of Patent: *May 27, 2025

(54) ANALOG AMPLITUDE PRE-DISTORTION CIRCUIT AND METHOD

(71) Applicant: NXP USA, Inc., Austin, TX (US)

(72) Inventors: Gerben Willem de Jong, Veldhoven (NL); Jozef Reinerus Maria Bergervoet, Eindhoven (NL); Mark Pieter van der Heijden, Eindhoven (NL); Bilal Elkassir, Colombelles (FR)

(73) Assignee: NXP USA, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/348,415

(22) Filed: Jul. 7, 2023

(65) Prior Publication Data

US 2024/0022216 A1 Jan. 18, 2024

(30) Foreign Application Priority Data

Jul. 13, 2022 (EP) .................................... 22306051

(51) Int. Cl.
*H04L 25/49* (2006.01)
*H03F 1/06* (2006.01)
(Continued)

(52) U.S. Cl.
CPC ............. *H03F 1/3241* (2013.01); *H03F 1/06* (2013.01); *H03F 1/302* (2013.01)

(58) Field of Classification Search
CPC .......... H03F 1/3241; H03F 1/06; H03F 1/302; H03F 3/195; H03F 2200/213;
(Continued)

(56) References Cited

U.S. PATENT DOCUMENTS 6,107,877 A * 8/2000 Miguelez .............. H03F 1/3276
330/149
10,284,148 B2 5/2019 D'Avino et al.
(Continued)

FOREIGN PATENT DOCUMENTS

JP        2003273660 A    9/2003
KR      20100099873 A    9/2010
KR        101058641 B1    8/2011

OTHER PUBLICATIONS

Kazuhisa Yamauchi, et al., "A Microwave Miniaturized Linearizer Using a Parallel Diode with a Bias Feed Resistance," IEEE Transactions on Microwave Theory and Techniques, vol. 45, No. 12, pp. 2431-2435, Dec. 1997.

(Continued)

*Primary Examiner* — Helene E Tayong

(57) ABSTRACT

An analog amplitude pre-distortion circuit includes a Radio Frequency, RF, input for receiving an RF signal. The circuit also includes an amplifier stage comprising an amplifier stage input for receiving the RF signal from the RF input, where the amplifier stage is operable to amplify the RF signal to produce an amplified RF signal. The circuit further includes a bias circuit. The bias circuit includes a detector stage for detecting an amplitude of the RF signal, and for producing a correction signal based on the amplitude of the RF signal. The bias circuit also includes a bias application stage coupled to the amplifier stage input.

10 Claims, 9 Drawing Sheets

(51) Int. Cl.
*H03F 1/30* (2006.01)
*H03F 1/32* (2006.01)

(58) Field of Classification Search
CPC ......... H03F 2200/222; H03F 2200/451; H03F 1/56; H03F 3/213; H03F 1/0266
USPC ........................................................ 375/297
See application file for complete search history.

(56) References Cited

U.S. PATENT DOCUMENTS

| | | | |
|---|---|---|---|
| 10,804,867 B2* | 10/2020 | Lehtola | H03F 3/602 |
| 2006/0139100 A1* | 6/2006 | Taylor | H03F 3/345 |
| | | | 330/302 |
| 2007/0075780 A1 | 4/2007 | Krvavac et al. | |
| 2008/0018404 A1* | 1/2008 | Wyse | H03F 1/305 |
| | | | 330/296 |
| 2008/0031382 A1* | 2/2008 | Aoki | H03G 1/04 |
| | | | 327/317 |
| 2008/0036534 A1 | 2/2008 | Liu | |
| 2018/0006021 A1 | 1/2018 | Bergervoet et al. | |
| 2018/0006611 A1 | 1/2018 | de Jong et al. | |
| 2018/0234057 A1 | 8/2018 | Chen et al. | |

OTHER PUBLICATIONS

Youn Sub Noh, "PCS/W-CDMA Dual-Band MMIC Power Amplifier With a Newly Proposed Linearizing Bias Circuit," IEEE Journal of Solid-State Circuits, vol. 37, No. 9, pp. 1096-1099, Sep. 2002.
U.S. Appl. No. 18/348,401, filed Jul. 7, 2023, not yet published, 27 pages.

* cited by examiner

ANALOG AMPLITUDE PRE-DISTORTION CIRCUIT AND METHOD

CROSS-REFERENCE TO RELATED APPLICATIONS

This application claims priority under 35 U.S.C. § 119 to European patent application no. 22306051.8, filed 13 Jul. 2022, the contents of which are incorporated by reference herein.

BACKGROUND

The present specification relates to a programmable analog amplitude pre-distortion circuit.

In Wireless Local Area Network (WLAN) Front-End Module (FEM) products, linearity is a key performance parameter, which may, for instance, require error-vector-magnitude (EVM) levels in the order of −47 dB and lower (e.g. 802.11ax for WiFi-6(e) and 802.11be for next generation WiFi-7 standards).

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided an analog amplitude pre-distortion circuit comprising:
- a Radio Frequency, RF, input for receiving an RF signal;
- an amplifier stage comprising an amplifier stage input for receiving the RF signal from the RF input, wherein the amplifier stage is operable to amplify the RF signal to produce an amplified RF signal; and
- a bias circuit comprising:
  - a detector stage for detecting an amplitude of the RF signal, and for producing a correction signal based on the amplitude of the RF signal; and
  - a bias application stage coupled to the amplifier stage input, wherein the bias application stage is operable to:
    - apply, according to the correction signal, a bias voltage at a first range of frequencies at first impedances to the amplifier stage input; and
    - present second impedances at a second range of frequencies to the amplifier stage input;
    - wherein the first impedances are lower than the second impedances and wherein the first range of frequencies are lower than the second range of frequencies.

According to another aspect of the present disclosure, there is provided an analog amplitude pre-distortion method comprising:
- receiving a Radio Frequency, RF, signal;
- using an amplifier stage to amplify the RF signal to produce an amplified RF signal; and
- applying bias voltages to an input of the amplifier stage by:
  - detecting an amplitude of the RF signal;
  - producing a correction signal based on the amplitude of the RF signal;
  - applying, according to the correction signal, a bias voltage at a first range of frequencies at first impedances to the amplifier stage input; and
  - presenting second impedances at a second range of frequencies to the amplifier stage input;
  - wherein the first impedances are lower than the second impedances and wherein the first range of frequencies are lower than the second range of frequencies.

The bias application stage may comprise a transistor having a control terminal coupled to an output of the detector stage for receiving the correction signal.

A first current terminal of the transistor of the bias application stage may be coupled to the amplifier stage input. A second current terminal of the transistor of the bias application stage may be coupled to a reference potential. The reference potential may, for instance, be ground.

The transistor of the bias circuit may be a bipolar transistor. The first current terminal of the bipolar transistor may be a collector terminal. The second current terminal of the bipolar transistor may be an emitter terminal. The control terminal of the bipolar transistor may be a base terminal.

A resistor may be coupled between the control terminal and the first current terminal. A capacitor may be coupled between the control terminal and the reference potential.

The detector stage may comprise a current mirror comprising a first transistor and a second transistor. A control terminal of the first transistor may be coupled to the RF input via a first variable reactance component. A control terminal of the second transistor may be coupled to the RF input via a second variable reactance component. A first current terminal of the first transistor may be coupled to a corresponding first current terminal of the second transistor. A second current terminal of the second transistor may be coupled to an output of the detector stage for outputting the correction signal.

The detector stage may comprise an RC network including at least one variable reactance component. The variable reactance component may operate, along with other components of the detector stage, to detect the amplitude of the RF signal, and to produce a correction signal based on the amplitude of the RF signal.

The circuit may further comprise:
- at least one further amplifier stage, each further amplifier stage having a respective amplifier stage input, wherein each further amplifier stage is coupled downstream of the amplifier stage to form a linear chain of amplifier stages;
- a further bias circuit for each respective further amplifier stage, each further bias circuit comprising:
- a respective further detector stage coupled to an output of a preceding amplifier stage in the linear chain, for producing a further correction signal based on the amplitude of the RF signal outputted by the output of the preceding amplifier stage in the linear chain;
- a respective further bias application stage coupled to an amplifier stage input of a next amplifier stage in the linear chain, wherein each further bias application stage is operable to:
  - apply, according to the further correction signal, a bias voltage at a first range of frequencies at first impedances to the amplifier stage input of the next amplifier stage in the linear chain; and
  - present second impedances at a second range of frequencies to the amplifier stage input;
- wherein the first impedances are lower than the second impedances and wherein the first range of frequencies are lower than the second range of frequencies.

The circuit may further comprise an output for outputting an amplified RF signal from the amplifier stage or from a final further amplifier stage in the linear chain.

The or each amplifier stage input may comprise a control terminal of a transistor. The transistor may be a bipolar junction transistor.

The detector stage may include at least one variable current source.

The circuit may further comprise a controller for programmably controlling the variable reactance component(s) of the or each detector stage for selectively adjusting the bias voltage applied by the bias application stage according to the correction signal(s).

The circuit may further comprise a correction signal modification block for producing a modified correction signal based on the correction signal outputted by the detector stage. The bias application stage may be operable to apply the bias voltages according to the modified correction signal.

The correction signal modification block may be operable to apply a modification to the correction signal based on:
 a linear amplification function for increasing the correction signal;
 a function for limiting the correction signal;
 a piece-wise-linear function; and/or
 a filter function.

According to a further aspect of the present disclosure, there is provided a power amplifier or a low noise amplifier comprising a circuit of the kind set out above.

For the purposes of this application, radio frequency (RF) signals may be considered to be signals in the frequency range 300 MHz≤f≤300 GHz. For instance, the RF signals may be in one of the following IEEE bands: C band=4-8 GHz, Ku band=12-18 GHz, Ka band=26.5-40 GHz, UHF, SHF and EHF bands: 300 MHz to 300 GHz.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1:
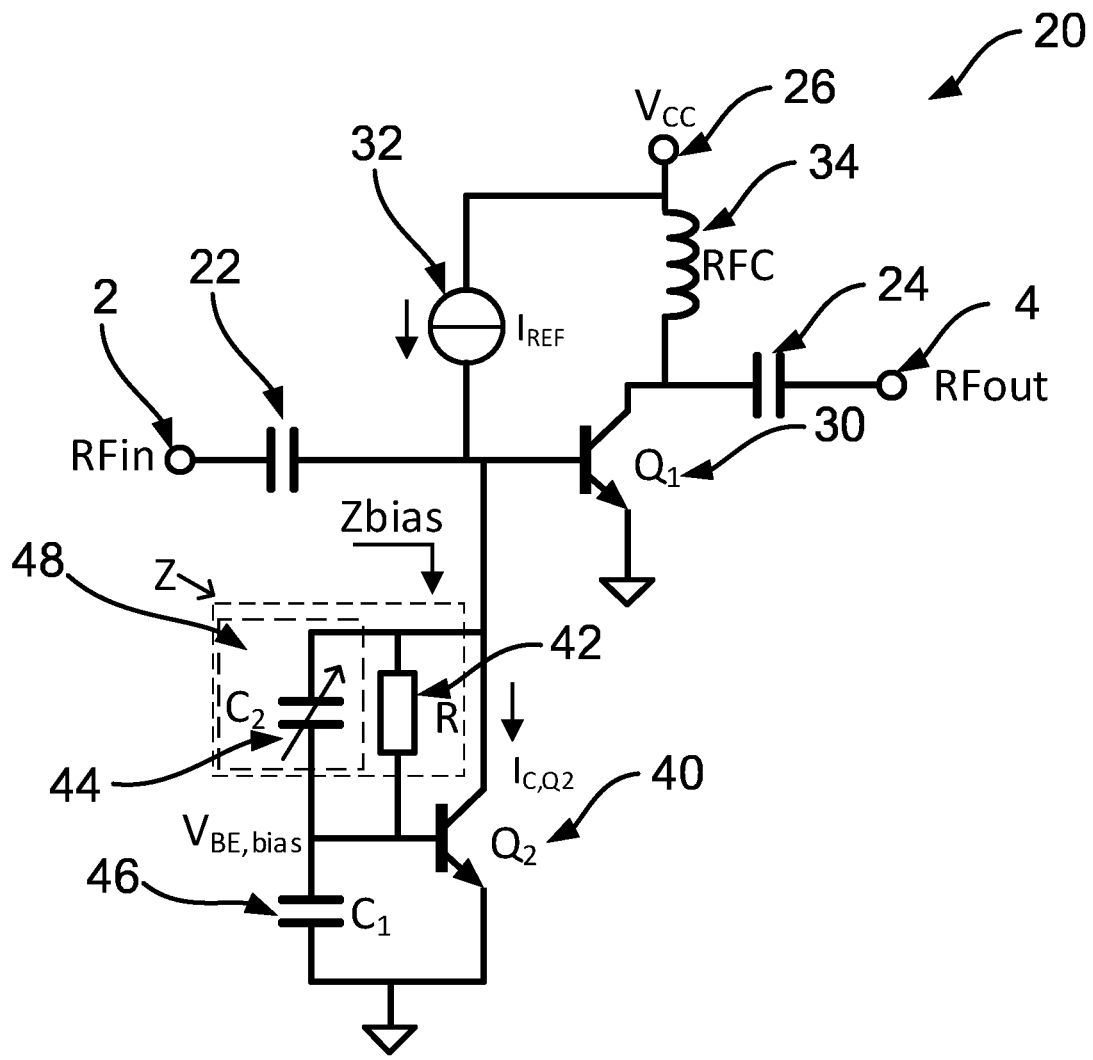
FIG. 1 shows an analog amplitude pre-distortion circuit.

FIG. 1 shows an analog amplitude pre-distortion circuit 20.

The circuit 20 includes a Radio Frequency (RF), input 2 for receiving an RF signal. The circuit 20 also includes an amplifier stage, which comprises a transistor 30. The transistor 30 may be a bipolar junction transistor, although it is envisaged that it would be possible to use other kinds of transistor. A control terminal (e.g. the base terminal) of the transistor 30 may be coupled to the input 2 to receive the RF signal from the input 2. A DC-blocking capacitor 22 may be coupled between the control terminal of the transistor 30 and the input 2.

It is envisaged that amplifier stage may be implemented as a basic common emitter (CE) stage using the transistor 30. However, the amplifier stage could also be implemented as a cascode (CE+CB) or a double cascode (CE+CB+CB) stage (where CB refers to a common base stage or transistor).

The circuit 20 may also include an RF output 4 for outputting an amplified RF signal, which corresponds to the RF signal received at the input 2, which has been amplified by the amplifier stage. A DC-blocking capacitor 24 may be coupled between the collector terminal of the transistor 30 and the output 4. Using the circuit of FIG. 1, the amplification of the RF signal provided by an amplification stage may be made more linear than can be achieved by prior circuits. In particular, the amount of gain expansion or gain compression may be reduced. This may be achieved by the bias circuit, to be described below.

The amplifier stage may also include a current source 32 for supplying a reference current $I_{ref}$. The current source 32 may be coupled to the control terminal of the transistor 30. A supply node 26 for supplying a supply voltage $V_{cc}$ may be coupled to the current source 32 and also to a first current terminal of the transistor 30 (which may be the collector terminal of the transistor 30). An RF choke 34 may be coupled between the supply node 26 and the aforementioned first current terminal of the transistor 30.

A second current terminal (which may be the emitter terminal) of the transistor 30 may be coupled to a reference voltage, such as ground.

As noted above, the circuit 20 also includes a bias circuit. The bias circuit includes a transistor 40. The transistor 40 may, for instance be a bipolar junction transistor, although it is envisaged that it would be possible to use other kinds of transistor. A first current terminal (e.g. a collector terminal) of the transistor 40 may be coupled to the amplifier stage input (e.g. to the control terminal (e.g. base terminal) of the transistor 30). Note that the first current terminal may thus also be coupled to the input 2. A second current terminal (e.g. an emitter terminal) of the transistor 40 is coupled to a reference voltage, e.g. to ground. The second current terminal of the transistor 40 is also coupled to a control terminal (e.g. base terminal) of the transistor via a capacitor $C_1$.

The transistor 40 is operable to bias the amplifier stage input (the control terminal (e.g. base) of the transistor 30). In the circuit 20, the transistor 40 and the transistor form a current mirror, with $I_{c1\_bias} = \{(Ae_1/Ae_2) \times I_{ref}\}$ in the absence of an RF signal, where $I_{c1\_bias}$ is the current (e.g. collector current) at the first current terminal of the transistor 30, $Ae_1$ is the emitter area of the transistor 30, $Ae_2$ is the emitter area of the transistor 40, and $I_{ref}$ is the reference current provided by the current source 32.

The transistor 40 may also operate as an electronic inductor (a gyrator). In particular, the transistor 40 may present a low-ohmic impedance for lower frequencies (in particular for DC and modulation frequencies, and may present a high-ohmic impedance for higher frequencies (in particular at RF frequencies).

The bias circuit also includes at least one variable reactance component 44. The variable reactance component may comprise a variable capacitor ($C_2$). The variable reactance component 44 is coupled between the control terminal (e.g. the base terminal) of the transistor 40 and the first current terminal (e.g. the collector terminal) of the transistor 40.

A resistor 42 may be provided. The resistor 42 may be coupled in parallel with the variable reactance component 44. Accordingly, the resistor 42 may also be coupled between the control terminal (e.g. the base terminal) of the transistor 40 and the first current terminal (e.g. the collector terminal) of the transistor 40. This resistor 42 may act to close the loop around the transistor 40 for DC and modulation frequencies.

The bias circuit is operable to detect an amplitude of the RF signal received at the RF input 2. In this respect, it is noted that to enable the detection of the amplitude, the control terminal (e.g. base terminal) of the transistor 40 is coupled to the RF input 2 via the variable reactance component 44.

The bias circuit is also operable to apply a bias voltage at a first range of frequencies according to the detected amplitude of the RF signal at first impedances to the amplifier stage input (e.g. to the control terminal of the transistor 30). The first range of frequencies may include a generally lower range of frequencies and may include DC (f=0) and modulation frequencies. The first impedances are typically lower impedances.

The bias circuit is further operable to present second impedances at a second range of frequencies to the amplifier stage input (e.g. to the control terminal of the transistor 30). The second range of frequencies may include a generally higher range of frequencies (in particular, higher frequencies than the first range of frequencies). The second range of frequencies may generally correspond to the RF frequencies to be amplified by the amplifier stage. Moreover, the second impedances are typically higher impedances (in particular higher than the first impedances.

Note that the coupling of the first current terminal (e.g. the collector terminal) of the transistor 40 to the amplifier stage input allows the bias circuit to apply the above mentioned bias voltages.

In this way, bias voltages can be applied by the bias circuit to the amplifier stage input (e.g. the base terminal of the transistor 30) at a relatively low impedances at the lower frequencies (including, for example, modulation frequencies and DC), whereas for the second frequencies (which, again, may generally correspond to the RF frequencies to be amplified by the amplifier stage), the bias circuit may present relatively high impedances (the "second impedances") to the amplifier stage input. This can allow an appropriate bias to be applied to the amplifier stage input for modulation frequencies and DC, while also avoiding loading the amplifier stage input (e.g. the base terminal of the transistor 30) at the frequencies to be amplified by the amplifier stage.

Accordingly, the transistor 40 may operate to detect the RF amplitude present at the base of the transistor 30 (for $C_2>0$, where $C_2$ is the capacitance of the variable reactance component 44). The larger the detected RF amplitude, the lower the base-emitter ($V_{be2}$) bias voltage is at the transistor 40, and therefore the lower the base-emitter ($V_{be1}$) bias voltage at the transistor 30 will be (thereby reducing the $I_{c1}$ bias current at the first current terminal (e.g. collector terminal) of the transistor 30 and therefore reducing the RF gain of the transistor 30. This effect can provide the possibility of reducing (correcting for) gain expansion, thereby allowing for an improvement in the linearity of the RF amplification performed by the amplifier stage. The bias voltage drop across the resistor 42 may be approximately zero (assuming that ($I_{b2}{\times}R$) is small enough, where R is the resistance of the resistor 42 and $I_{b2}$ is the current flowing into the base of the transistor 40).

Further details of the operation of the bias circuit of FIG. 1 are set out below.

The bias circuit shown in FIG. 1 may be used as a current mirror, e.g. for a power amplifier core cell. As such, the transistor 40 may be considered to be a bias replica transistor of the transistor 30 within the current mirror. Through the gyration of the RC time constant ($R{\times}(C_1+C_{be2})$) (where $C_{be2}$ is the base-emitter capacitance of the transistor 40)), an inductive impedance as a function of frequency is created. The values of R and C may be chosen such that the bias circuit presents a high impedance to the control terminal (e.g. the base) of the transistor 30 at the fundamental RF frequency (i.e. to avoid loading the control terminal (e.g. the base) of the transistor 30) and a relatively low impedance across the modulation bandwidth. This is favorable for low-memory-effect designs.

Figure 2:
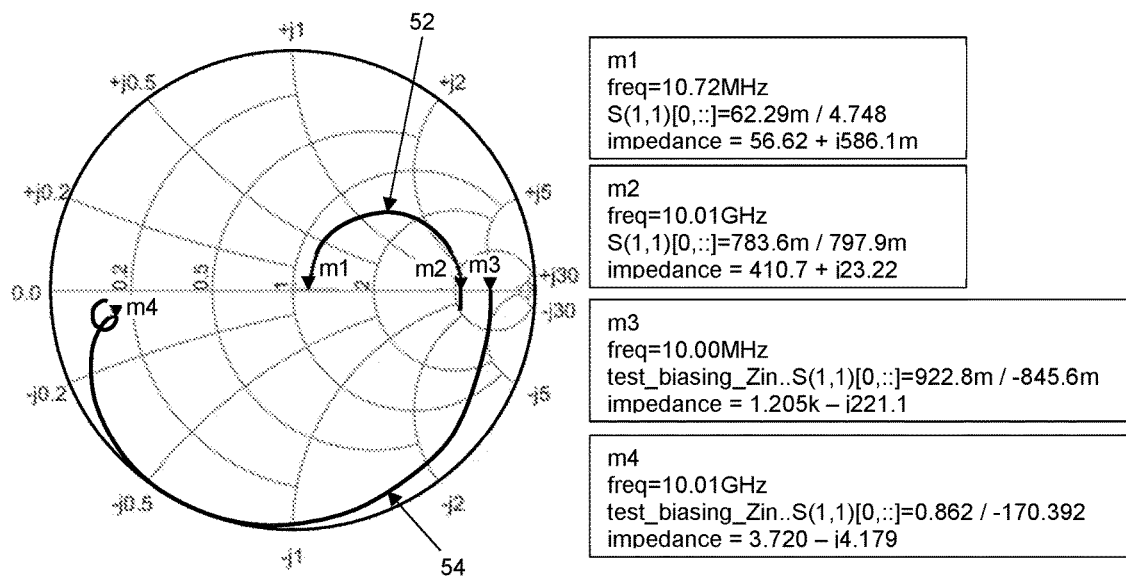
FIG. 2 shows a Smith Chart for the circuit of FIG. 1.

This can be seen from FIG. 2, which shows a Smith Chart for the embodiment of FIG. 1. The equations below show the derivation of the output impedance of the bias circuit, assuming that the variable reactance component (e.g. the variable capacitor 44 ($C_2$)) is absent. This illustrates the basic operation principle of the bias circuit.

$$Z_{BIAS} = \frac{1 + j\omega RC_1}{gm + j\omega C_1} = r_e\left(\frac{1 + j\omega RC_1}{1 + j\omega r_e C_1}\right)$$

$$\xrightarrow{\omega=0} Z_{BIAS} \approx r_e = 1/gm$$

$$\xrightarrow{\omega=\infty} Z_{BIAS} \approx R$$

In FIG. 2, the plot 52 shows the bias impedance $Z_{BIAS}$ produced by the bias circuit, while the plot 54 shows $Z_{IN,OS}$, namely the impedance looking into the input of the output stage. FIG. 2 illustrates that $|Z_{BIAS}|<<|Z_{IN,OS}|$ for modulation frequencies and $|Z_{BIAS}|>>|Z_{IN,OS}|$ for RF.

With the introduction of the variable reactance component (e.g. the variable capacitor 44 ($C_2$)), the bias circuit can control the gain compression through the variable capacitor 44 thereby to allow more or less RF swing at the control terminal (e.g. the base) of the transistor 40 as a function of RF drive level.

The introduction of the variable reactance component (e.g. the variable capacitor 44 ($C_2$)) can create a capacitive voltage divider $C_2/(C_1+C_{be2}+C_2)$ within the bias circuit for controlling how much of the RF signal received at the input 2 is coupled into the control terminal (e.g. the base) of the base of the transistor 40. By allowing more RF swing at the base and through rectification across the base-emitter diode of the transistor 40, the bias base voltage as function of input power can be effectively lowered. This can result in lower $I_{bias}$ vs power, resulting in less gain expansion and effectively a reduction of amplitude-to-amplitude (AM-to-AM) distortion making the amplifier more linear.

Additionally, the capacitive voltage divider can be made programmable through implementing the capacitor $C_1$ and/or the capacitor $C_2$ as a variable capacitor (e.g. variable reactance is implemented by the variable capacitor 44 ($C_2$)).

This can allow the amount of gain expansion correction to be variable/programmable. This can be a very useful property in an Error Vector Magnitude (EVM) trimming procedure during final test of a product incorporating the analog amplitude pre-distortion circuit 20.

Figures 3A, 3B:
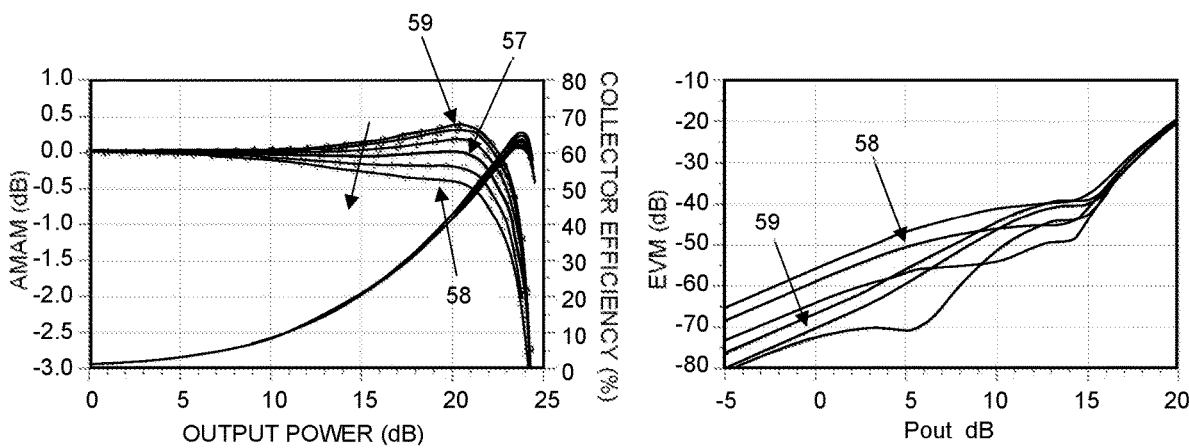
FIG. 3A shows amplitude-amplitude (AM-AM) distortion and collector efficiency vs output power for the circuit of FIG. 1.
FIG. 3B shows plots of Error Vector Magnitude (EVM) vs output power for the circuit of FIG. 1.

To illustrate these advantages, FIG. 3A shows:

Amplitude-amplitude (AM-to-AM) distortion and collector efficiency vs output power for the circuit of FIG. 1 when sweeping the variable capacitor 44 ($C_2$) from 0 fF (plot 59) to 100 fF (plot 58), with 60 fF (plot 57) as the optimal value; and FIG. 3B shows Error Vector Magnitude (EVM) vs output power for the circuit of FIG. 1 when sweeping the variable capacitor 44 ($C_2$) from 0 fF (plot 59) to 100 fF (plot 58), with 60 fF (plot 57) as the optimal value.

Thus, FIGS. 3A and 3B shows the AM-to-AM characteristics when varying the variable capacitor 44 ($C_2$), which may be considered to be an 'RF-ripple control capacitor'. When the capacitance of the variable capacitor 44 ($C_2$) is zero, gain expansion in the AM-to-AM characteristic is observed. At an optimal setting (e.g. the AM-to-AM characteristic is nearly flat. However, when overcompensated or too much ripple is allowed at the base of the transistor 40, the AM-to-AM characteristic exhibits gain compression.

In some embodiments, the circuit of FIG. 1 may be modified to add a beta helper, so as to provide the bias circuit with a lower-ohmic output. In accordance with these modifications:

A beta helper may be coupled between the first current terminal of the transistor 40 and the amplifier stage input;

The resistor 42 may remain directly coupled between the amplifier stage input and the control terminal of the transistor 40 (the same may apply the to the variable reactance component 44);

The current source 32 may be coupled between a voltage \Ta d and the first current terminal of the transistor 40 (as in FIG. 1) but may not be coupled to the amplifier stage input (unlike in FIG. 1);

The beta helper may be coupled between the voltage $V_{dd}$ and the reference potential (e.g. ground), for providing the beta helper with a supply voltage.

As noted above, the beta helper can provide the bias circuit with a lower-ohmic output. In that case, the circuit may be less sensitive for the current gain (beta) of the transistor 30 and for the impedance of the DC-blocking capacitor at the RF input (modulation frequencies).

In accordance with embodiments of this disclosure, the amplification of the RF signal provided by an amplification stage may be made more linear than can be achieved by prior circuits. In particular, the amount of gain expansion or gain compression may be reduced. This may be achieved by a bias circuit having a detector stage and a bias application stage, to be described below.

The embodiments of FIGS. 4-9, to be described below, have features in common with the circuit described above in relation to FIGS. 1-3. The circuit of FIGS. 1-3 has been described above to aid in the understanding of embodiments of this disclosure. The circuit of FIGS. 1-3 are thus illustrative but do not form part of the state of the art for this disclosure.

Figure 4:
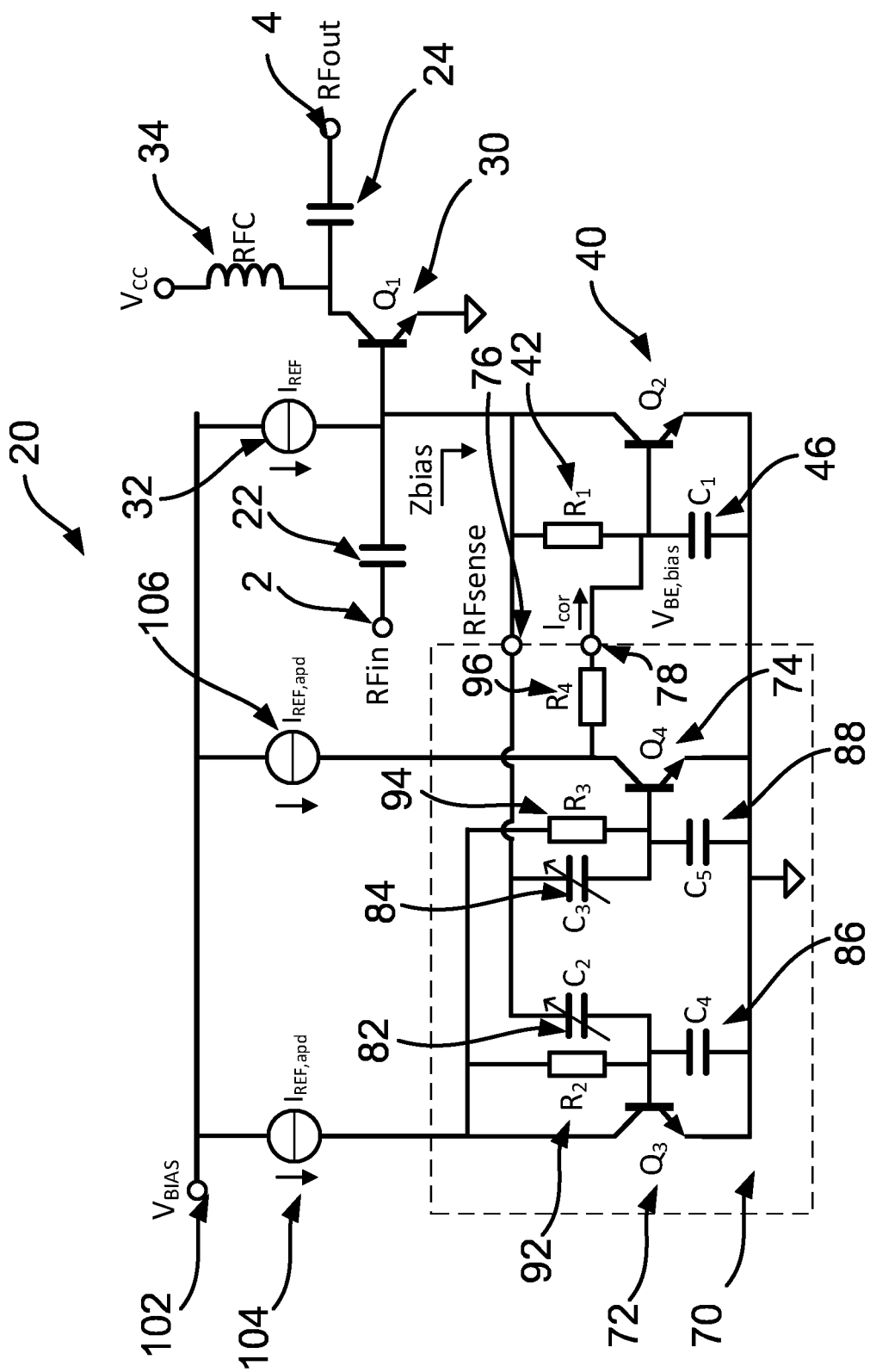
FIG. 4 shows an analog amplitude pre-distortion circuit according to an embodiment of this disclosure.

FIG. 4 shows an analog amplitude pre-distortion circuit 20 according to an embodiment of this disclosure. While the circuit of FIG. 1 can provide unidirectional AM-to-AM linearity control, the embodiment of FIG. 4 can provide bi-directional AM-to-AM linearity control. Unlike the circuit shown in FIG. 1, in the embodiments of FIGS. 4-9, the function of detecting the amplitude of the RF signal received at the input 2 and the function of applying the bias to the amplifier stage input are performed separately (as opposed to both being performed by the transistor 40). Accordingly, in the embodiments of FIGS. 4-9, a separate detector stage is provided, and the transistor 40 forms part of a bias application stage. It is this separation of the functions that may allow the bi-directional AM-to-AM linearity control to be achieved.

In this embodiment, the RF input 2, the amplifier stage (including, for example, the transistor 30) and the RF output 4 are configured in the same way as the corresponding RF input 2, the amplifier stage and RF output 4 in FIG. 1 and accordingly the description of those features will therefore not be repeated here. An exception to this is that in the embodiment of FIG. 4, the current source 32 is not coupled to the supply voltage $V_{cc}$ but is instead coupled to a bias voltage node 102, which applies a bias voltage $V_{BIAS}$.

In this embodiment, the analog amplitude pre-distortion circuit 20 includes a bias application stage. The bias application stage includes a transistor 40 ($Q_2$), a resistor 42 ($R_1$) and a capacitor 46 ($C_1$). It is noted that the transistor 40 ($Q_2$), a resistor 42 ($R_1$) and a capacitor 46 ($C_1$) are coupled together in much the same way as the corresponding transistor 40 ($Q_2$), a resistor 42 ($R_1$) and a capacitor 46 ($C_1$) shown in FIG. 1. Again, the transistor 40 may, for instance be a bipolar junction transistor, although it is envisaged that it would be possible to use other kinds of transistor. A first current terminal (e.g. a collector terminal) of the transistor 40 may be coupled to the amplifier stage input (e.g. to the control terminal (e.g. base terminal) of the transistor 30). Again, note that the first current terminal may thus also be coupled to the input 2. A second current terminal (e.g. an emitter terminal) of the transistor 40 is coupled to a reference voltage, e.g. to ground. The second current terminal of the transistor 40 is also coupled to a control terminal (e.g. base terminal) of the transistor via a capacitor $C_1$. Again, the resistor 42 may be provided, and again the resistor 42 may be coupled between the control terminal (e.g. the base terminal) of the transistor 40 and the first current terminal (e.g. the collector terminal) of the transistor 40. Again, this resistor 42 may act to close the loop around the transistor 40 for DC and modulation frequencies.

Note that unlike FIG. 1, the resistor 42 in this embodiment is not coupled in parallel with a variable capacitor 44. Instead, while the resistor is coupled between the first current terminal and the control terminal of the transistor 40 the resistor 42, in this embodiment is also coupled across an node 76 and a node 78 of the detector stage 70 to be described below. The node 76 acts as an RF sense node of the detector stage, for detecting an amplitude of the RF signal received at the input 2, and the node 78 acts as an output of the detector stage 70, for outputting a correction signal to the bias application stage. In this respect, note that the node 78 is coupled to the control terminal of the transistor 40, so that the correction signal may be applied to the control terminal. As will also be described below, the correction signal is based on the detected amplitude of the RF signal.

In the present embodiment, the correction signal takes the form of a current $I_{cor}$. An output resistor 96 ($R_4$) may be coupled to the output node 78 for reducing the RF content in the current $I_{cor}$ to a desired range/level in accordance with design requirements.

As noted above the RF sense input node 76 is coupled to the input 2 (e.g. via the DC-blocking capacitor 22), to receive the RF signal from the input.

In this embodiment, the detector stage 70 includes two variable reactance components: a first variable capacitor 82 ($C_2$) and a second variable capacitor 84 ($C_3$). A first terminal of the first variable capacitor 82 and a first terminal of the second variable capacitor 84 are coupled to the RF sense input node 76.

In this embodiment, the detector stage 70 also includes are first transistor 72 ($Q_3$) and a second transistor 74 ($Q_4$). The transistors 72, 74 may, for instance be bipolar junction transistors as shown in FIG. 4, although it is envisaged that it would be possible to use other kinds of transistor. A second terminal of the first variable capacitor 82 is coupled to a control terminal (e.g. base) of the first transistor 72, and a second terminal of the second variable capacitor 84 is coupled to a control terminal (e.g. a base terminal) of the second transistor 74.

A first current terminal (e.g. an emitter terminal) of the first transistor 72 is coupled to a reference potential (e.g. ground) via a first capacitor 86 ($C_4$). A first current terminal (e.g. an emitter terminal) of the second transistor 74 is coupled to the reference potential (e.g. ground) via a second capacitor 88 ($C_5$).

A second current terminal (e.g. a collector terminal) of the first transistor 72 is coupled to a first current source 104. The first current source 104 supplies a current $I_{REF,apd}$. The first current source 104 may also be coupled to the bias voltage node 102.

A second current terminal (e.g. a collector terminal) of the second transistor 74 is coupled to the output node 78 (e.g. via the output resistor 96). The second current terminal of the second transistor 74 is also coupled to a second current source 106. The second current source 106 supplies a current $I_{REF,apd}$. The second current source 106 may also be coupled to the bias voltage node 102.

In this embodiment, the detector stage 70 may further include a first resistor 92 and a second resistor 94. The first resistor 92 may be coupled between the second current terminal of the first transistor 72 and the control terminal of the first transistor 72. The second resistor 94 may be coupled between the second current terminal of the first transistor 72 and the control terminal of the second transistor 74.

The operation of the detector stage 70 in this embodiment, which is aimed at improving the AM-to-AM transfer in both directions, may be as follows.

In FIG. 4, assuming that $C_2/(C_2+C_4+C_{be3})$ is larger than $C_3/(C_3+C_5+C_{be4})$ [where $C_{be3}$ and $C_{be4}$ are the base-emitter capacitances of the first transistor 72 and the second transistor 74, respectively], the gain expansion of the amplifier stage (transistor 30) will be reduced (this can be useful in the case of a small quiescent current). Conversely, if $C_3/(C_3+C_5+C_{be4})$ is larger than $C_2/(C_2+C_4+C_{be3})$, the gain compression produced by the amplifier stage (transistor 30) will be reduced (this can be useful in case of a large quiescent current, when operating at very high frequencies, for example).

In FIG. 4, the first transistor 72 and the second transistor 74 form a current mirror, which may have a default ratio of 1:1. Therefore, in the absence of an RF signal at the RF sense input node 76, the collector current of the second transistor 74 cancels with $I_{REF,apd}$ and no current flows through the output resistor 96 (the correction signal outputted by the detector stage to the control terminal of the transistor 40 of the bias application stage=0). Accordingly, in this case, the circuit around the first transistor 72 and the second transistor 74 does not change the bias point as defined by the circuit around the replica transistor 40.

However, if, for example, an RF signal is injected via the first variable capacitor 82 ($C_2$) into the control terminal (e.g. base terminal) of the first transistor 72 ($Q_3$), then the base-emitter voltage $V_{be}$ of the first transistor 72 will drop due to rectification. Therefore, the collector current L of the second transistor 74 will drop and a net current will flow through the resistor 96 (now the correction signal outputted by the detector stage to the control terminal of the transistor 40 of the bias application stage≠0). This current will also flow through the resistor 42 and as a result, the bias voltage at the control terminal (e.g. base terminal) of the transistor 30 will drop, resulting in a reduction of the initial gain expansion.

Conversely, when, for example, an RF signal is injected via the second variable capacitor 84 ($C_3$) into the control terminal (e.g. base terminal) of the second transistor 74 ($Q_4$), then this causes the average value of the collector current of the second transistor 74 ($Q_4$) to increase, due to the exponential transfer from $V_{be}$ to $I_C$ (this transfer function will also be described below in relation to FIG. 7). Since now the average collector current (its bias component) has become larger than $I_{REF,apd}$, current starts to flow through the resistor 96 ($R_4$), toward the node 78 (accordingly, the correction signal now outputted by the detector stage to the control terminal of the transistor 40 of the bias application stage is again ≠0, but with the opposite polarity to the first case described above). This current will also flow through the resistor 42 and as a result, the bias voltage at the control terminal (e.g. base terminal) of the transistor 30 will increase, resulting in a reduction of the initial gain compression.

Figure 5A:
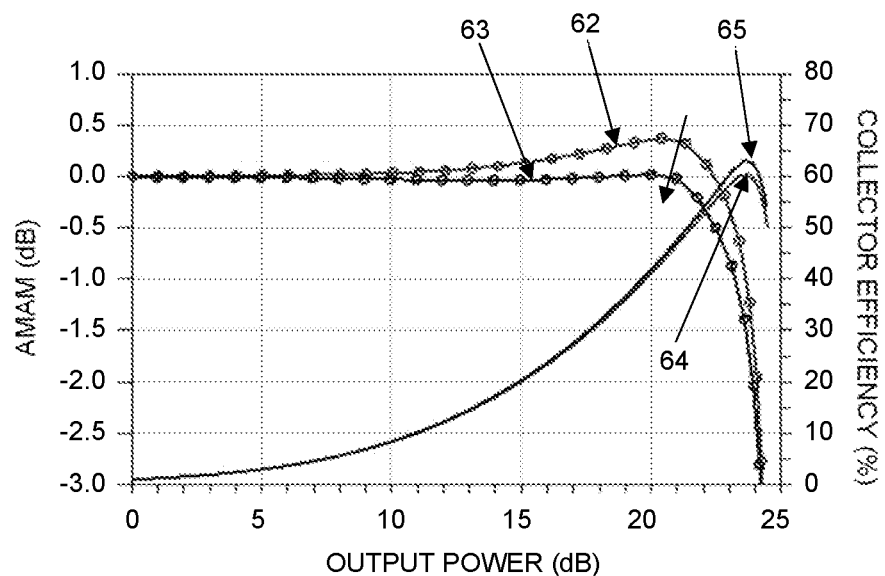
FIGS. 5A and 5B illustrate the properties of the analog amplitude pre-distortion circuit of FIG. 4 for an actual power amplifier circuit.
Figure 5B:
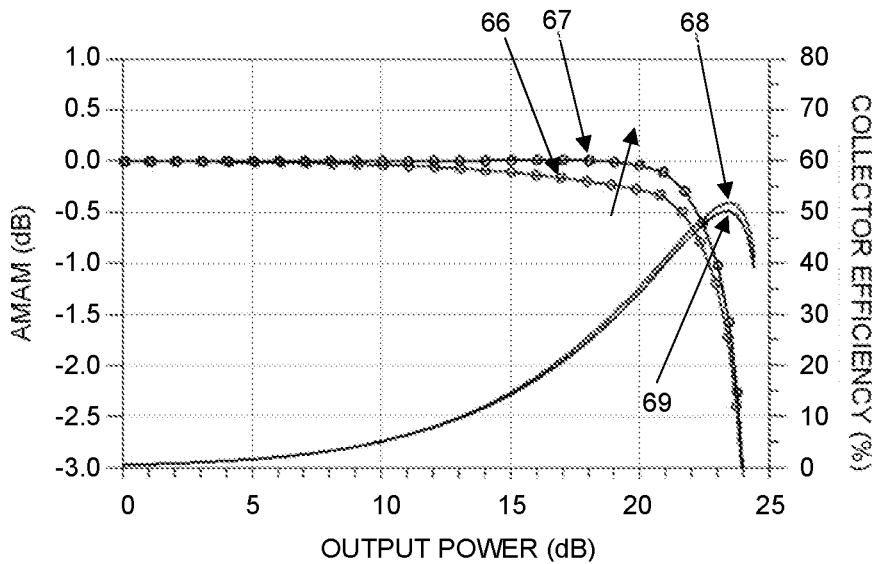

An illustration of the properties of the analog amplitude pre-distortion circuit 20 of FIG. 4 are shown in FIG. 5 for an actual power amplifier circuit. In particular:

FIG. 5A shows the AM-to-AM distortion and collector efficiency vs output power for a class-AB power amplifier with gain expansion for $C_3$ (i.e. the second variable capacitor 84)=0 and when $C_2$ (i.e. the first variable capacitor 82) is changed from 0 (plots 62, 64) to 40 fF (plots 63, 65), correcting for the gain expansion, and FIG. 5B shows, a class-A power amplifier with gain compression for $C_2$ (i.e. the first variable capacitor 82)=0 and when $C_3$ (i.e. the second variable capacitor 84) is changed from 0 (plots 66, 68) to 80 fF (plots 67, 69), correcting for gain compression.

Accordingly, in the embodiment of FIG. 4, similar to the circuit of FIG. 1, the bias application stage is operable to apply a bias voltage at a first range of frequencies according to the amplitude of the RF signal at first impedances to the amplifier stage input, and to present second impedances at a second range of frequencies to the amplifier stage input. Unlike FIG. 1 however, the embodiment of FIG. 4 includes a bias application circuit, which bases the application of the bias voltage on a correction signal received from a separate detector stage.

More specifically therefore, the bias application stage is operable to apply, according to the correction signal, a bias voltage at a first range of frequencies at first impedances to the amplifier stage input, and to present second impedances at a second range of frequencies to the amplifier stage input. The first impedances are lower than the second impedances and wherein the first range of frequencies are lower than the second range of frequencies. The first frequencies may, for instance, be DC and/or modulation frequencies. The second frequencies may, for instance, be the RF frequencies to be amplified by the amplification stage.

As with the circuit of FIG. 1, in FIG. 4 by presenting the second impedances at a second range of frequencies to the amplifier stage input, loading of the control terminal (base) of the transistor 30 at those (higher) second frequencies can be avoided, thereby preventing attenuation of the RF signal. Similar considerations apply to the embodiment of FIG. 6.

Figure 6:
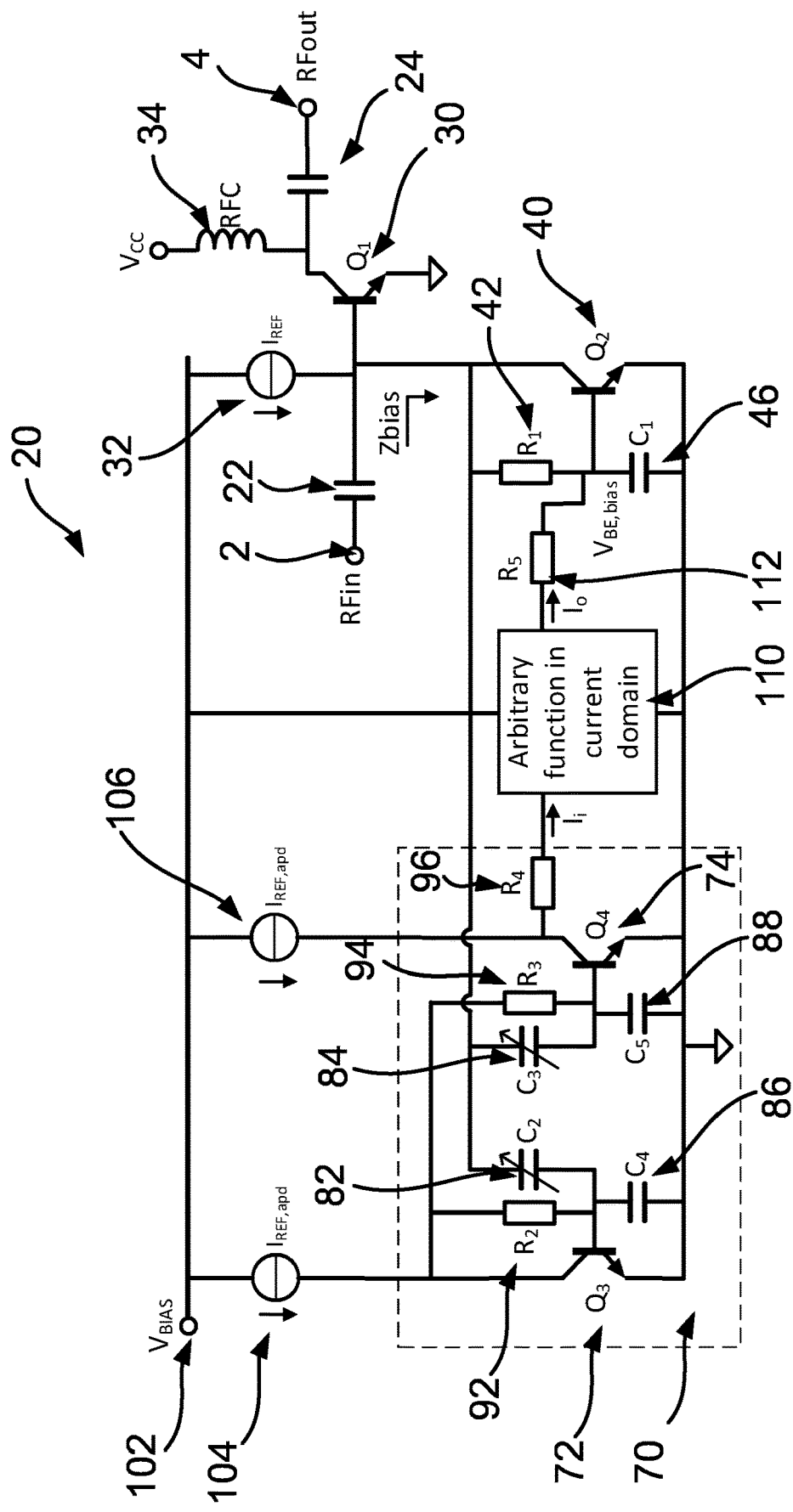
FIG. 6 shows an analog amplitude pre-distortion circuit according to a further embodiment of this disclosure.

FIG. 6 shows an analog amplitude pre-distortion circuit 20 according to a further embodiment of this disclosure. The embodiment of FIG. 6 is similar to the embodiment of FIG. 4 and accordingly only the differences between FIG. 6 and FIG. 4 will be described below.

In the embodiment of FIG. 6, the output of the detector stage 70 is coupled to an input of a correction signal modification block 110, to allow the correction signal modification block 110 to receive the correction signal (denoted $I_i$ in FIG. 6). An output of the correction signal modification block 110 is coupled to the control terminal (e.g. base terminal) of the transistor 40, to allow the correction signal modification block 110 to pass a modified version of the correction signal (denoted $I_o$ in FIG. 6) to the bias application stage. In some embodiments, a resistor 112 may be coupled between the output of the correction signal modification block 110 and the control terminal (e.g. base terminal) of the transistor 40. The correction signal modification block 110 may also be coupled to the bias voltage node 102 and to the aforementioned reference potential (e.g. ground).

The correction signal modification block 110 is operable to produce a modified correction signal based on the correction signal outputted by the detector stage 70. Consequently, in this embodiment, the bias application stage is operable to adjust the bias applied by the bias application stage to the amplifier stage input according to the modified correction signal produced by the correction signal modification block 110.

The correction signal modification block 110 can apply any required modification function to the correction signal $I_i$ for producing the modified correction signal $I_o$ (e.g. in the current domain), which may in some embodiments be considered to be a "corrected" correction signal. By way of example, modification function may comprise any of the following:
- a linear amplification function for increasing the correction signal;
  - linear amplification of this kind may also be used to reduce the capacitive loading on the amplifier stage input by the variable capacitors 82 ($C_2$) and/or 84 ($C_3$) while obtaining the same amount of correction;
- a function for limiting the correction signal;
  - this can reduce the amount of correction for higher RF-amplitudes, thereby possibly increasing the 1-dB compression point of the RF amplifier stage;
- a piece-wise-linear function; and/or
- a filter function
  - e.g. to correct for memory effects.

In this embodiment, the resistors 96 ($R_4$), 112 ($R_5$) may form a barrier for the RF signals (including higher harmonics), since the base-band transfer $I_i \rightarrow I_o$ of the arbitrary-function block and the operation of the transistor 40 might otherwise be adversely affected by the presence of RF-signals.

Figure 7:
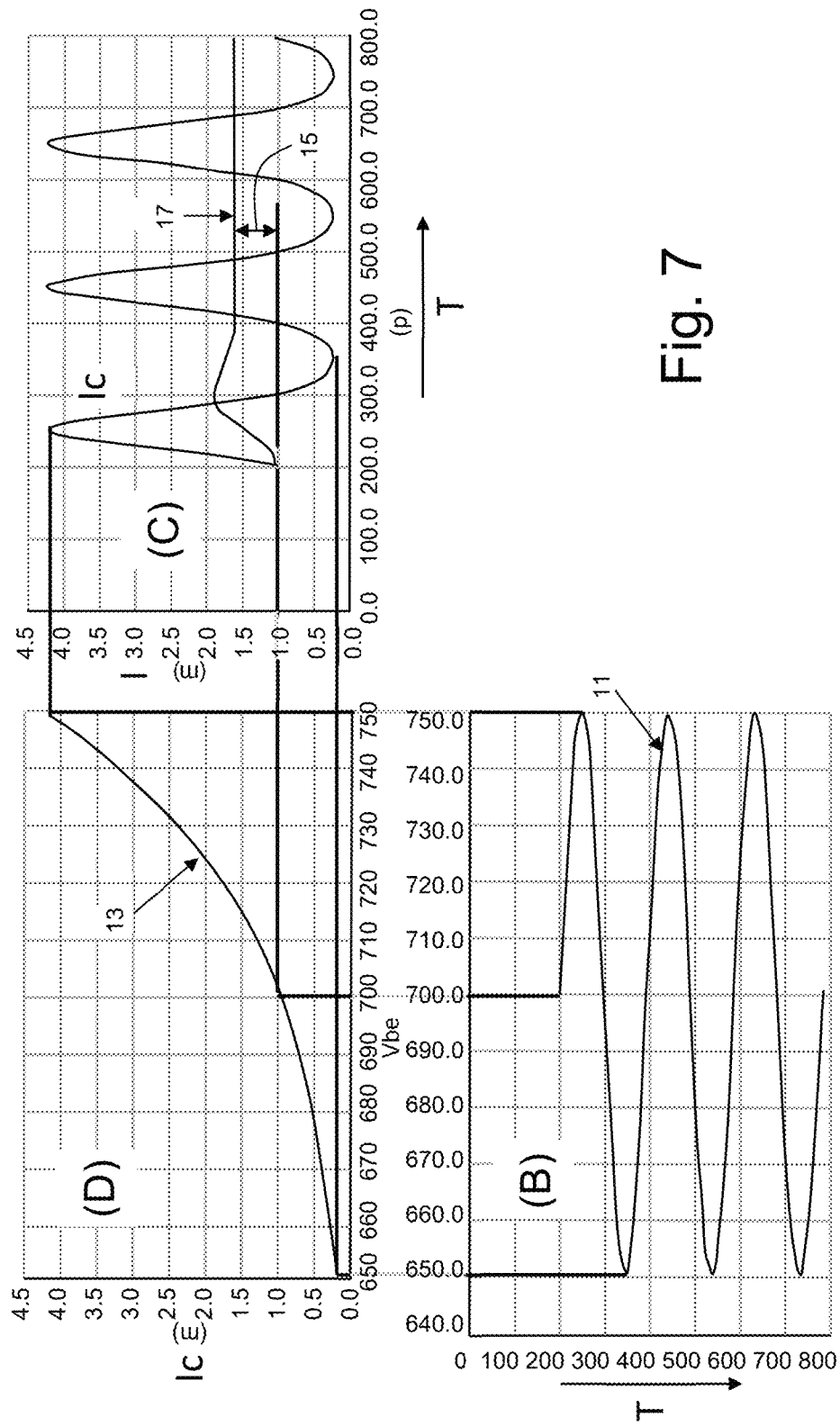
FIG. 7 illustrates a principle of operation of the circuits shown in FIGS. 1 to 6.

FIG. 7 further illustrates a principle of operation of the circuit of FIG. 1 and the embodiments of FIGS. 4 and 6. In FIG. 7, three plots are shown. Plot B shows the base-emitter voltage ($V_{be}$) 11 of a bipolar junction transistor as a function of time. Plot C shows the collector current ($I_C$) of the bipolar junction transistor as a function of time, and also the moving average 17 of $I_C$ over time. Plot D shows the non-linear (substantially exponential, in this example) transfer function 13 ($I_C$ as a function of $V_{be}$) of the bipolar junction transistor, for linking plot B to plot C.

In plot B, before t=200 ps, the base-emitter voltage $V_{be}$ of the bipolar junction transistor is a fixed bias voltage of $V_{be}$=700 mV. The transistor's non-linear transfer in plot D translates $V_{be}$ to a bias collector current $I_C$ of 1 mA, as shown in plot C.

Returning to plot B, from t=200 ps, an RF (5 GHz, in this example) sinusoidal component with a 50 mV amplitude is added to the already-present bias component of 700 mV. As a result, $V_{be}$ swings between (700-50)=650 mV and (700+50)=750 mV. The transistor's non-linear transfer function (plot D) translates this sinusoidal $V_{be}$ swing to a distorted-sinusoidal swing in $I_C$, as shown in plot C. The positive signal excursions in $V_{be}$ (with respect to the bias component of 700 mV) yield relatively large positive signal excursions in $I_C$ (with respect to the initial bias component of 1 mA), while the negative signal excursions in $V_{be}$ yield relatively small negative signal excursions in $I_C$. This asymmetric behaviour is a consequence of the non-linear $V_{be}$-to-$I_C$ transfer of the transistor as shown in plot D. As a result, the moving-average value (bias component) of $I_C$ increases (see plot C, moving average line 17).

The description of FIG. 7 set out above corresponds generally to the behaviour of the RF-amplitude detector around the second bipolar junction transistor 74 ($Q_4$) in FIGS. 4 and 6, assuming $C_{2=0}$ and $C_3>0$. The bias component of $Q_4$'s $V_{be}$ is constant (determined by $Q_3$, $R_2$ and $I_{REF,apd}$ and passed through $R_3$). In the presence of an RF signal at the control terminal (base) of the transistor 30 ($Q_1$) of the amplifier stage, a certain amount of RF ripple will be applied to the control terminal (base) of the second transistor 74 ($Q_4$), via the capacitive voltage divider ($C_3$ and ($C_5$ in parallel with $C_{be4}$)).

In the presence of this RF ripple, $V_{be}$ of the second transistor 74 ($Q_4$) is shown in plot B of FIG. 7 for t>200 ps, while $I_C$ of the second transistor 74 ($Q_4$) is shown in plot C of FIG. 7. The (unwanted) RF component in $I_C$ may be (e.g. strongly) suppressed by the low-pass filter formed by the output capacitance of the second transistor 74 ($Q_4$), the resistor 96 ($R_4$) and ($C_1$ in parallel with $C_{be2}$) (pi-network). After this low-pass filtering, only the moving-average value (bias component) of $I_C$ remains (corresponding to moving average line 17). Initially, (e.g. at t<200 ps), both $I_C$ and $I_{REF,apd}$ are equal to 1 mA, so $I_{cor}$=0 mA. When t>400 ps, the moving-average value of $I_C$ equals 1.6 mA, so the correction signal $I_{cor}$=(1-1.6)=-0.6 mA. The correction signal $I_{cor}$ will develop a bias voltage drop across $R_1$.

The situation for the transistor 40 ($Q_2$) of the circuit of FIG. 1 (which, as set out above, performs both the amplitude detection function and the bias application function in that circuit) and for the RF-amplitude detector around the first transistor 72 ($Q_3$) in FIGS. 4 and 6 is slightly different compared to that for the RF-amplitude detector around the second transistor 74 ($Q_4$) in FIGS. 4 and 6. This difference can be described with reference to FIGS. 4 and 6.

In FIGS. 4 and 6, the first transistor 72 ($Q_3$) has a feedback resistor, namely the first resistor 92 ($R_2$), coupled between the collector and the base terminals of that transistor 72 ($Q_3$). Note that the second transistor 74 ($Q_4$) does not have such a feedback resistor. The feedback resistor 92 ($R_2$) closes the loop around the first transistor 72 ($Q_3$) for DC and modulation frequencies. (However, for high frequencies (e.g. RF frequencies), the loop gain is relatively small due to the low-pass filter formed by the feedback resistor 92 ($R_2$) and the first capacitor 86 ($C_4$) in parallel with the base-emitter capacitance ($C_{be3}$) of the first transistor 72 ($Q_3$).)

Because of the feedback provided via the feedback resistor 92 ($R_2$), the collector current ($I_{C3}$) of the first transistor 72 ($Q_3$) is (almost) equal to $I_{REF,apd}$. When an RF signal becomes present on the base of the transistor 30 ($Q_1$) of the amplifier stage, a part of this RF signal voltage arrives at the base of the first transistor 72 ($Q_3$), via the capacitive voltage divider ($C_2$ and ($C_4$ in parallel with $C_{be3}$)). In this case we assume $C_2 > 0$ and $C_{3=0}$. Initially, the events as described above for the second transistor 74 ($Q_4$), will now occur for the first transistor 72 ($Q_3$): the RF-ripple voltage on the base of the first transistor 72 ($Q_3$) will result in an increase of its bias collector current $I_{C3}$. Since now $I_{C3}$ becomes larger than $I_{REF,apd}$, the current difference will flow through the feedback resistor 92 ($R_2$) and the second resistor 94 ($R_3$) and will discharge ($C_4$ in parallel with $C_{be3}$) and ($C_5$ in parallel with $C_{be4}$). Therefore, the base-emitter voltage $V_{be3}$ of the first transistor 72 ($Q_3$) (and also the base-emitter voltage $V_{be4}$ of the second transistor 74 ($Q_4$)) will gradually decrease, and finally Ica will be (almost) equal again to $I_{REF,apd}$. This process should be fast enough to follow the modulation of the RF-amplitude (the envelope of the carrier). Since $V_{be4}$ also dropped, the collector current ($I_{C4}$) of the second transistor 74 ($Q_4$) has now become smaller than $I_{REF,apd}$. The difference in current between $I_{C4}$ and $I_{REF,apd}$ will flow through the resistor 96 ($R_4$) as the correction signal $I_{cor}$, but now in the opposite direction compared to the direction described above in relation to the second transistor 74 ($Q_4$). Again, $I_{cor}$ will develop a bias voltage drop across the resistor 42 ($R_1$), but with opposite polarity compared to that described above in relation to the second transistor 74 ($Q_4$).

Figure 8:
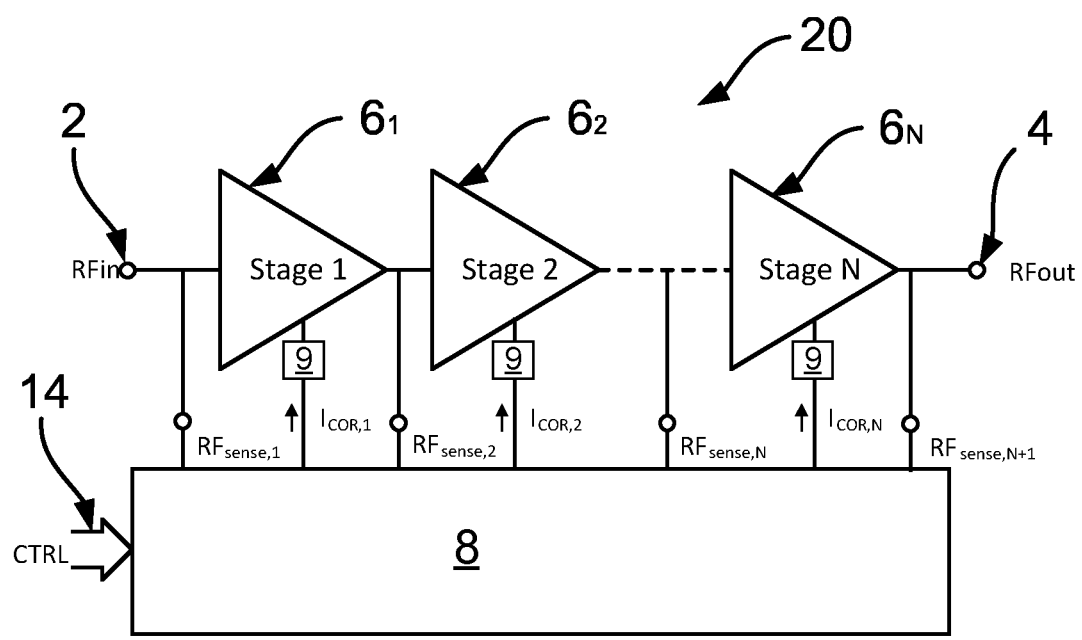
FIG. 8 shows an analog amplitude pre-distortion circuit according to a further embodiment of this disclosure.
Figure 9:
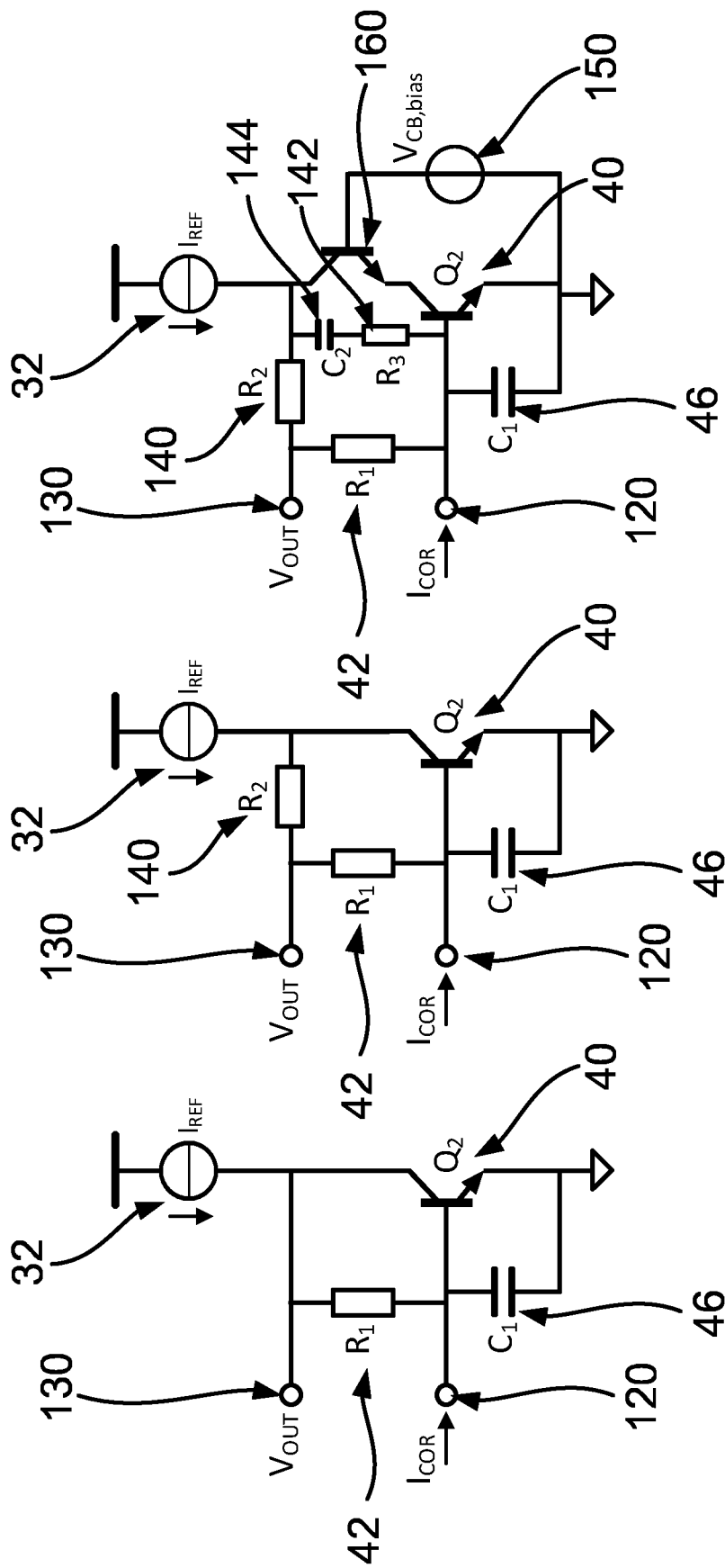
FIGS. 9A, 9B and 9C show various types of bias application stages according to further embodiments of this disclosure.

FIG. 8 shows an analog amplitude pre-distortion circuit 20 according to another embodiment of this disclosure.

In this embodiment, multiple amplifier stages $6_1, 6_2 \ldots 6_N$ may be linked together in series to form a linear chain of amplifier stages. A first amplifier stage $6_1$ in the linear chain is coupled to the RF input 2 of the analog amplitude pre-distortion circuit 20. A final amplifier stage $6_N$ of the linear chain is coupled to the RF output 4 of the analog amplitude pre-distortion circuit 20. One or more intermediate amplifier stages ($6_2 \ldots$) may each have an RF input which is coupled to an RF output of a preceding amplifier stage in the linear chain. The one or more intermediate amplifier stages ($6_2 \ldots$) may each have an RF output which is coupled to an RF input of a next amplifier stage in the linear chain. The RF input of the final amplifier stage $6_N$ is coupled to the RF output of the penultimate ($6_{(N-1)}$) amplifier stage in the linear chain. The RF output of the first amplifier stage $6_1$ is coupled to the RF input of the second amplifier stage $6_2$.

Each amplifier stage in the linear chain may be an amplifier stage of the kind described above in relation to the preceding embodiments. The input of each amplifier stage in the linear chain may, for instance correspond to the RF input 2 of the amplifier stages shown in, for example, FIGS. 4 and 6. The output of each amplifier stage in the linear chain may, for instance correspond to the RF output 4 of the amplifier stages shown in, for example, FIGS. 4 and 6.

In this embodiment, each amplifier stage is provided with a respective detector stage and a respective bias application stage 9 of the kind described above. The detector stages are shown collectively in FIG. 8 as block 8. The reactances (e.g. capacitors) of the various variable reactance components (e.g. variable capacitors) of the detector circuits in the block 8 may be controlled by control signals 14, thereby to tune the correction signals produced and outputted by those detector circuits to their respective bias application stages 9. In some embodiments, a controller may be provided for providing the control signals 14, for programmably controlling the variable reactance components.

Note that in FIG. 8, the detector stage of each amplifier stage in the linear chain is coupled to the input of that amplifier stage (e.g. the output of a preceding amplifier stage in the linear chain) so as to sense the RF signal that is coupled into that amplifier stage. The bias application stages 9 are also coupled to their amplifier stages so as to adjust the bias voltage at each respective amplifier stage input according to the correction signal outputted by each respective detector stage. Although the various bias application stages may be provided within the block 8, it is also envisaged that the bias application stages may be considered to be included in the amplifier stages 6, or separately as shown in FIG. 8 (FIG. 8 is schematic in this respect).

The embodiment of FIG. 8 can, on an amplifier block level, allow the freedom to choose where the RF input is sensed. Furthermore, the detector stages could be used to drive the bias input of any of the N amplifier stages in the linear chain. The embodiment of FIG. 8 may allow each amplifier stage in the linear chain to receive an optimal scaled or post-processed bias signal.

FIGS. 9A, 9B and 9C show various types of bias application stages that may be used according to further embodiments of this disclosure. According to embodiments of this disclosure, it is envisaged that bias application stages of the kinds shown in any of FIG. 9A, 9B or 9C may be incorporated into any of the analog amplitude pre-distortion circuits described above.

Each of the bias application stages described herein may also implement the function of an electronic, active gyrator. The gyrator function can operate to present (at the amplifier stage input) an active inductance, so as to allow the bias voltages applied by the bias application stage to have a desired inductive impedance, without needing to use an actual inductor component.

FIG. 9A will be recognised as being a bias application stage of the kind already described above in relation to, for example, FIGS. 4 and 6 and is shown again here in FIG. 9A for comparison with the bias application stages shown in FIGS. 9B and 9C. For instance, note that the nodes 120, 130 in FIG. 9A correspond to the node 78 and the node 76 in FIG. 4, respectively.

The bias application stage shown in FIG. 9B adds a further resistor 140 compared to the bias application stage of FIG. 9A. The further resistor 140 is coupled between the node 130 (or the resistor 42) and the first current terminal (e.g. a collector terminal) of the transistor 40. The bias application stage of FIG. 9B can operate as a low-noise gyrator compared to the bias application stage of FIG. 9A.

The bias application stage shown in FIG. 9C adds a number of further components compared to the bias application stage of FIG. 9B.

The bias application stage of FIG. 9C includes a further transistor 160. The further transistor 160 may be a bipolar junction transistor, although it is envisaged that it would be possible to use other kinds of transistor. A control terminal (e.g. a base terminal) of the further transistor is coupled to a voltage source 150, which supplies a voltage $V_{CB,bias}$. The voltage source 150 is also coupled to the aforementioned reference potential (e.g. ground).

The further transistor 160 is coupled between the first current terminal (e.g. a collector terminal) of the transistor 40 and the amplifier stage input (e.g. to the control terminal (e.g. base terminal) of the transistor 30). For instance, a first current terminal (e.g. a collector terminal) of the further transistor 160 may be coupled to the amplifier stage input and a second current terminal (e.g. an emitter terminal) of the further transistor 160 may be coupled to the first current terminal of the transistor 40. The control terminal (e.g. base) of transistor 30 is coupled to the terminal $V_{OUT}$ in FIG. 9C.

The bias application stage of FIG. 9C also includes a further capacitor 144 and a further resistor 142 coupled together in series. The further capacitor 144 and further resistor 142 are coupled between the control terminal of the transistor 40 and the first current terminal of the further transistor 160. Note that in this embodiment, the resistor 140 is also coupled to the first current terminal of the further transistor 160, instead of to the first current terminal of the transistor 40 as shown in the embodiment of FIG. 9B.

The bias application stage of FIG. 9C can operate as a low-noise gyrator compared to the bias application stage of FIG. 9A and is further suited as a low memory effect gyrator bias circuit.

In some embodiments, an analog amplitude pre-distortion circuit 20 of the kind described herein may be provided within a power amplifier. In some embodiments, an analog amplitude pre-distortion circuit 20 of the kind described herein may be provided within a low-noise amplifier. Amplifiers of this kind may be used in, for example, Wireless Local Area Network (WLAN) front end modules (FEM). Amplifiers of this kind may also be used in, for example, millimeter wave analog beam forming (MMW ABF) applications. Amplifiers of this kind may further be used in, for example, driver and pre-driver applications for base station infrastructure.

In some embodiments, an analog amplitude pre-distortion method is provided. The method includes receiving a Radio Frequency, RF, signal (e.g. at an input 2 of the kind described above) and using an amplifier stage (e.g. of the kind described above) to amplify the RF signal to produce an amplified RF signal. The method also includes applying bias voltages to an input of the amplifier stage. According to embodiments of this disclosure, this may be achieved by (i) detecting an amplitude of the RF signal (ii) producing a correction signal based on the amplitude of the RF signal, (iii) applying, according to the correction signal, a bias voltage at a first range of frequencies at first impedances to the amplifier stage input, and (iv) presenting second impedances at a second range of frequencies to the amplifier stage input. As described above, the first impedances are lower than the second impedances and wherein the first range of frequencies are lower than the second range of frequencies. Steps (i) and (ii) may be performed by a detector stage of the kind described above. Steps (iii) and (iv) may be performed by a bias application stage of the kind described above.

Figure 10:
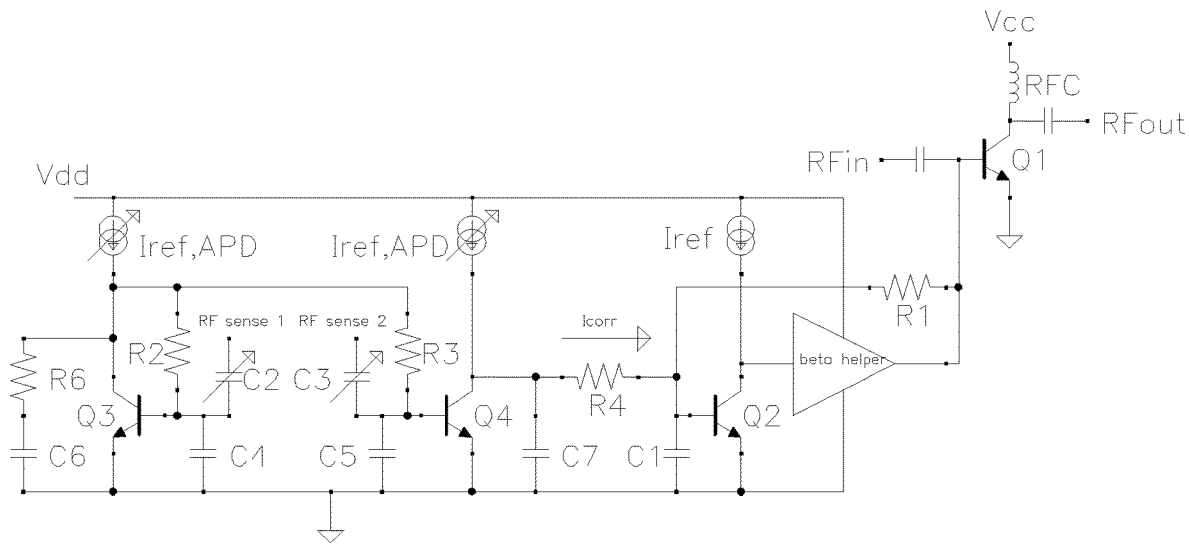
FIG. 10 shows an analog amplitude pre-distortion circuit according to another embodiment of this disclosure.

As with the example shown in FIG. 1, a beta helper may be added to the embodiments shown in either FIG. 4 or FIG. 6, so as to provide the bias circuit with a lower-ohmic output. FIG. 10 shows a modified version of FIG. 4 in this respect, while FIG. 11 shows a modified version of FIG. 6.

In accordance with the modifications shown in FIG. 10, with respect to FIG. 4:
- A beta helper may be coupled between the first current terminal of the transistor 40 and the amplifier stage input;
- The current source 32 may be coupled between a voltage $V_{dd}$ and the first current terminal of the transistor 40 (as in FIG. 4) but may not be coupled to the amplifier stage input (unlike in FIG. 4);
- The beta helper may be coupled between the voltage $V_{dd}$ and the reference potential (e.g. ground), for providing the beta helper with a supply voltage;
- As explained in more detail below, variable capacitors 82 and 84 may be coupled to a node for sensing the RF signal—note that this node need not be the node 76 as shown in FIG. 4;
- A further capacitor ($C_7$) may be coupled between the first current terminal (e.g. the collector terminal) of the transistor 74 ($Q_4$), to provide a low-ohmic path for the RF component of the collector current ($I_{C4}$) of the transistor 74 ($Q_4$);
- Another further capacitor ($C_6$) may be coupled between the current terminals of the transistor 72 ($Q_3$) to provide a low-ohmic path for the RF component of the collector current ($I_{C3}$) of the transistor 72 ($Q_3$); and
- A further resistor ($R_6$) may be coupled in series with the further capacitor ($C_6$) coupled between the current terminals of the transistor 72 ($Q_3$) to increase the phase margin of the loop around the transistor 72 ($Q_3$) and the resistor 92 ($R_2$) to improve stability.

Figure 11:
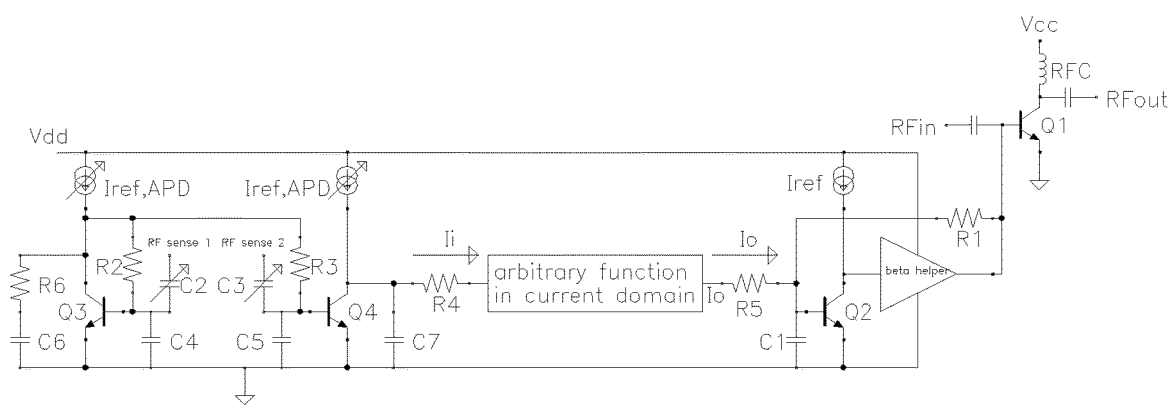
FIG. 11 shows an analog amplitude pre-distortion circuit according to a further embodiment of this disclosure.

In accordance with the modifications shown in FIG. 11, with respect to FIG. 6:
- A beta helper may be coupled between the first current terminal of the transistor 40 and the amplifier stage input;
- The current source 32 may be coupled between a voltage $V_{dd}$ and the first current terminal of the transistor 40 (as in FIG. 6) but may not be coupled to the amplifier stage input (unlike in FIG. 6);
- The beta helper may be coupled between the voltage $V_{dd}$ and the reference potential (e.g. ground), for providing the beta helper with a supply voltage;
- As explained in more detail below, variable capacitors 82 and 84 may be coupled to a node for sensing the RF signal—note that this node need not be the node 76 as shown in FIG. 6;
- A further capacitor ($C_7$) may be coupled between the first current terminal (e.g. the collector terminal) of the transistor 74 ($Q_4$), to provide a low-ohmic path for the RF component of the collector current ($I_{C4}$) of the transistor 74 ($Q_4$);
- Another further capacitor ($C_6$) may be coupled between the current terminals of the transistor 72 ($Q_3$) to provide a low-ohmic path for the RF component of the collector current ($I_{C3}$) of the transistor 72 ($Q_3$); and
- A further resistor ($R_6$) may be coupled in series with the further capacitor ($C_6$) coupled between the current terminals of the transistor 72 ($Q_3$) to increase the phase margin of the loop around the transistor 72 ($Q_3$) and the resistor 92 ($R_2$) to improve stability.

As noted above, the beta helper in the embodiments shown in FIGS. 10 and 11 can provide the bias circuit with a lower-ohmic output. In that case, the circuit may be less sensitive for the current gain (beta) of the transistor 30 and for the impedance of the DC-blocking capacitor at the RF input (modulation frequencies).

In FIGS. 10 and 11, the node coupled to the variable capacitor 82 ($C_2$) that is labelled "RF sense 1" and the node coupled to the variable capacitor 84 ($C_3$) that is labelled "RF sense 2" may be coupled to a number of different points in the circuit for sensing the RF signal. For instance, these nodes may be coupled to any of the following:
- the amplifier stage input and/or the RF input 2 as noted above in respect of FIGS. 4 and 6;
- the node 76 shown in FIG. 4;

the first current terminal (e.g. collector terminal) of the transistor 30 ($Q_1$);

the RF output 4; or a node located within another (e.g. preceding) amplifier stage in a linear chain of the kind shown in FIG. 8.

In some embodiments, including the embodiments shown in FIGS. 10 and 11, the amount of AM-to-AM correction can not only be controlled with ripple capacitors 82 ($C_2$) and 84 ($C_3$), but also by changing the current $I_{REF,apd}$ produced by the current sources 104, 106. Note that the current sources 104, 106 in FIGS. 10 and 11 are variable current sources, for modifying $I_{REF,apd}$. This approach may be easier to implement (DC solution), compared to embodiments using programmable capacitors (RF). It is also envisaged that the variable current sources may be used in combination with the variable reactance components noted above.

Accordingly, there has been described an analog amplitude pre-distortion circuit and method. The circuit includes a Radio Frequency, RF, input for receiving an RF signal. The circuit also includes an amplifier stage comprising an amplifier stage input for receiving the RF signal from the RF input, wherein the amplifier stage is operable to amplify the RF signal to produce an amplified RF signal. The circuit further includes a bias circuit. The bias circuit includes a detector stage for detecting an amplitude of the RF signal, and for producing a correction signal based on the amplitude of the RF signal. The bias circuit also includes a bias application stage coupled to the amplifier stage input. The bias application stage is operable to apply, according to the correction signal, a bias voltage at a first range of frequencies at first impedances to the amplifier stage input. The bias application circuit is also operable to present second impedances at a second range of frequencies to the amplifier stage input. The first impedances are lower than the second impedances. The first range of frequencies are lower than the second range of frequencies.

Although particular embodiments of this disclosure have been described, it will be appreciated that many modifications/additions and/or substitutions may be made within the scope of the claims.

The invention claimed is:

1. An analog amplitude pre-distortion circuit comprising:
   a Radio Frequency, RF, input for receiving an RF signal;
   an amplifier stage comprising an amplifier stage input coupled to the RF input for receiving the RF signal, wherein the amplifier stage is operable to amplify the RF signal to produce an amplified RF signal; and
   a bias circuit including
      a transistor having a first current terminal, a second current terminal and a control terminal, wherein the first current terminal is coupled to the amplifier stage input and wherein the second current terminal is coupled to a reference potential,
      a resistor coupled between the amplifier stage input and the control terminal of the transistor,
      a variable reactance component comprising a variable capacitor coupled between the amplifier stage input and the control terminal of the transistor,
      a controller for programmably controlling the variable reactance component to vary a capacitance of the variable reactance component, and
      a capacitor coupled between the control terminal and the reference potential,
   wherein the bias circuit is operable to
      detect an amplitude of the RF signal,
      apply a bias voltage at a first range of frequencies according to the amplitude of the RF signal at first impedances to the amplifier stage input, and
      present second impedances at a second range of frequencies to the amplifier stage input,
      wherein the first impedances are lower than the second impedances and wherein the first range of frequencies are lower than the second range of frequencies.

2. The circuit of claim 1, further comprising an output for outputting an amplified RF signal from the amplifier stage.

3. The circuit of claim 1, further comprising a current source coupled to the first current terminal.

4. The circuit of claim 1, wherein the transistor is a bipolar transistor, wherein the first current terminal is a collector terminal of the bipolar transistor, wherein the second current terminal is an emitter terminal of the bipolar transistor, and wherein the control terminal is a base terminal of the bipolar transistor.

5. The circuit of claim 1, wherein the amplifier stage input comprises a control terminal of a transistor.

6. The circuit of claim 1, further comprising a DC-blocking capacitor coupled between the RF input and the amplifier stage input.

7. A power amplifier or a low noise amplifier comprising:
   a Radio Frequency, RF, input for receiving an RF signal;
   an amplifier stage comprising an amplifier stage input coupled to the RF input for receiving the RF signal, wherein the amplifier stage is operable to amplify the RF signal to produce an amplified RF signal; and
   a bias circuit including
      a transistor having a first current terminal, a second current terminal and a control terminal, wherein the first current terminal is coupled to the amplifier stage input and wherein the second current terminal is coupled to a reference potential,
      a resistor coupled between the amplifier stage input and the control terminal of the transistor,
      a variable reactance component comprising a variable capacitor coupled between the amplifier stage input and the control terminal of the transistor,
      a controller for programmably controlling the variable reactance component to vary a capacitance of the variable reactance component, and
      a capacitor coupled between the control terminal and the reference potential,
   wherein the bias circuit is operable to
      detect an amplitude of the RF signal,
      apply a bias voltage at a first range of frequencies according to the amplitude of the RF signal at first impedances to the amplifier stage input, and
      present second impedances at a second range of frequencies to the amplifier stage input,
      wherein the first impedances are lower than the second impedances and wherein the first range of frequencies are lower than the second range of frequencies.

8. An analog amplitude pre-distortion method comprising:
   receiving a Radio Frequency, RF, signal;
   using an amplifier stage to amplify the RF signal to produce an amplified RF signal; and
   applying bias voltages to an input of the amplifier stage by
      detecting an amplitude of the RF signal,
      applying a bias voltage at a first range of frequencies according to the amplitude of the RF signal at first impedances to the amplifier stage input, and
      presenting second impedances at a second range of frequencies to the amplifier stage input, wherein the first impedances are lower than the second impedances and wherein the first range of frequencies are lower than the second range of frequencies, wherein a bias circuit is used to apply the bias voltages to the amplifier stage input, wherein the bias circuit includes
- a transistor having a first current terminal, a second current terminal and a control terminal, wherein the first current terminal is coupled to an amplifier stage input of the amplifier stage and wherein the second current terminal is coupled to a reference potential,
- a resistor and a variable reactance component comprising a variable capacitor coupled in parallel between the amplifier stage input and the control terminal of the transistor, and
- a capacitor coupled between the control terminal and the reference potential,
- and wherein the method further comprises programmably controlling the variable reactance component to vary a capacitance of the variable reactance component, to vary the bias voltages applied to the amplifier stage input.

9. The method of claim 8, wherein the transistor is a bipolar transistor, wherein the first current terminal is a collector terminal of the bipolar transistor, wherein the second current terminal is an emitter terminal of the bipolar transistor, and wherein the control terminal is a base terminal of the bipolar transistor.

10. The method of claim 8, wherein the amplifier stage input comprises a control terminal of a transistor.

* * * * *